United States Patent [19]

Schreiber et al.

[11] Patent Number: 5,414,373

[45] Date of Patent: May 9, 1995

[54] AUTOMATIC TRANSISTOR CHECKER

[75] Inventors: Paul T. Schreiber, Fort Worth, Tex.; Douglas R. Curtis, Los Gatos, Calif.

[73] Assignee: Tandy Corporation, Fort Worth, Tex.

[21] Appl. No.: 195,149

[22] Filed: Feb. 14, 1994

Related U.S. Application Data

[63] Continuation of Ser. No. 858,860, Mar. 27, 1992, Pat. No. 5,355,082.

[51] Int. Cl.⁶ .............................................. G01R 1/04
[52] U.S. Cl. .................................. 324/768; 324/73.1; 324/158.1
[58] Field of Search ............... 324/765, 768, 769, 114, 324/158.1

[56] References Cited

U.S. PATENT DOCUMENTS 5,355,082 10/1994 Schreiber et al. .................. 324/768

Primary Examiner—Kenenth A. Wieder
Assistant Examiner—Barry C. Bowser
Attorney, Agent, or Firm—Cesari and McKenna

[57] ABSTRACT

An automatic transistor checking method is provided, whereby an unknown, bipolar transistor may be typed, pinned and checked for forward DC gain, $H_{fe}$. The method is suitable for portable instruments, because the method uses little battery current to perform the $H_{fe}$ measurement. The method automatically determines transistor type (NPN or PNP) and pinout, making it suitable for quick checking of batches of unknown devices.

5 Claims, 6 Drawing Sheets

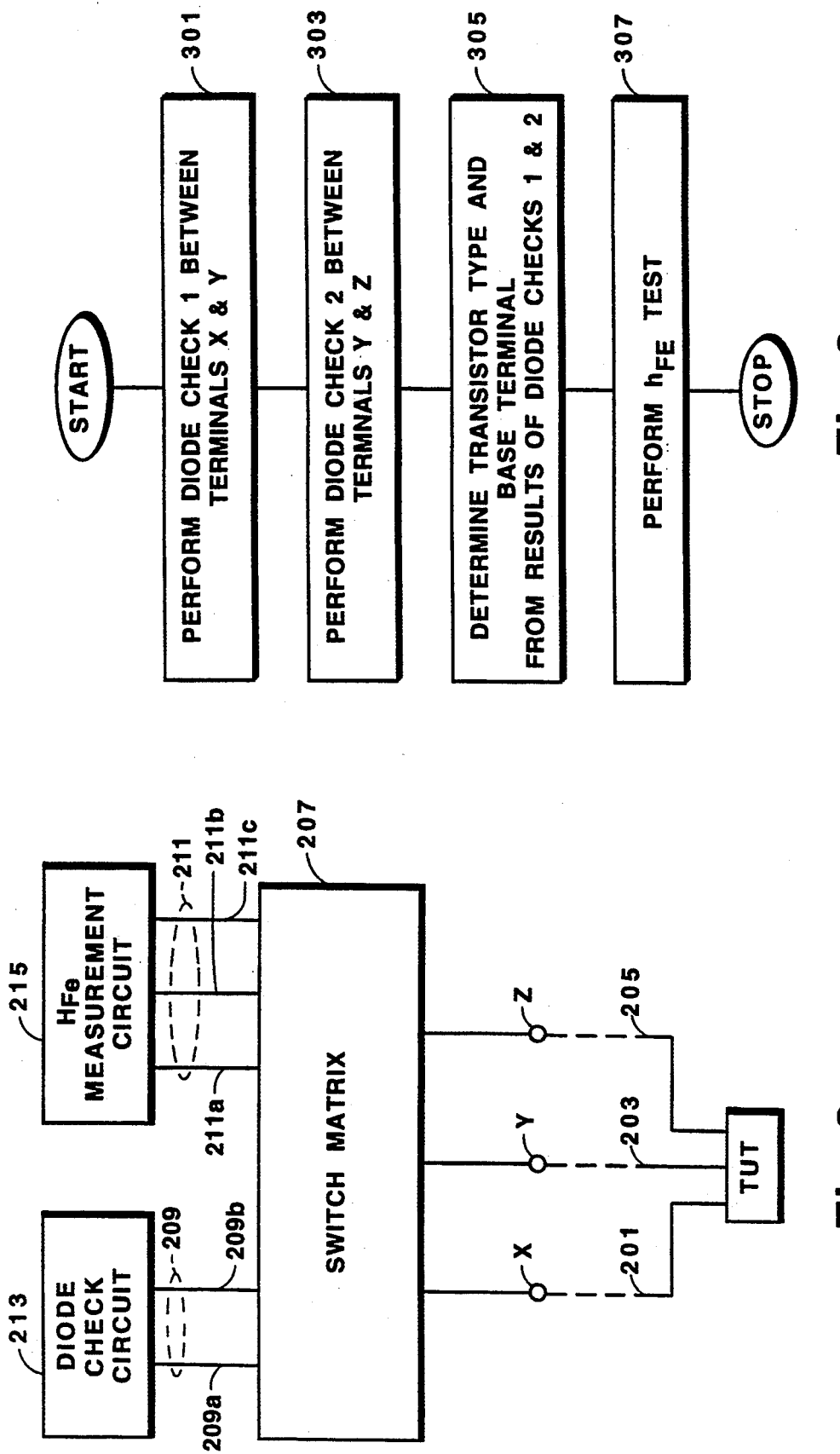

| DIODE CHECK 1 RESULT | DIODE CHECK 2 RESULT | TRANSISTOR TYPE | TRANSISTOR BASE TERMINAL |
|---|---|---|---|
| OPEN | Y ─▷|─ Z | PNP | Z |
| OPEN | Y ─|◁─ Z | NPN | Z |
| X ─▷|─ Y | Y ─▷|─ Z | PNP | Y |
| X ─▷|─ Y | OPEN | NPN | X |
| X ─|◁─ Y | Y ─|◁─ Z | NPN | Y |
| X ─|◁─ Y | OPEN | PNP | X |

FIG. 4

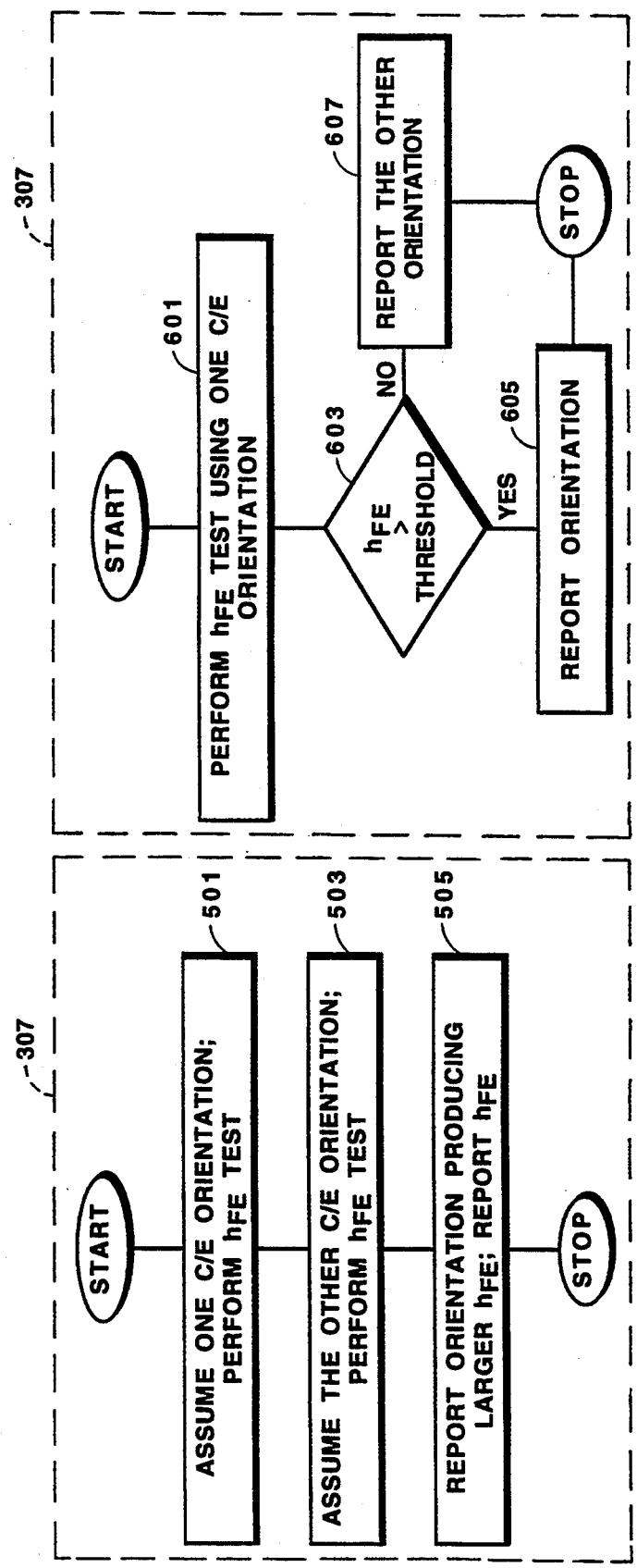

5,414,373

AUTOMATIC TRANSISTOR CHECKER

This application is a continuation of Ser. No. 08/858,860, now U.S. Pat. No. 5,355,082.

FIELD OF THE INVENTION

This invention relates generally to the field of measurement instruments and, more particularly, to automatic transistor testers for determining transistor pinout, type and DC gain ($H_{fe}$) of bipolar junction transistors.

DISCUSSION OF THE PRIOR ART

Transistor testers are known which can readily measure the forward DC gain, $H_{fe}$, of a bipolar junction transistor (BJT). The general topology of such a tester is shown in FIGS. 1A and 1B. In FIG. 1A, the tester is configured for measurement of an NPN type of transistor. In FIG. 1B, the tester is configured for the measurement of a PNP type of transistor. As seen in both FIGS. 1A and 1B, $H_{fe}$ is generally measured by injecting a small current $I_B$ into the base terminal B of the transistor under test (TUT), and measuring the resulting current $I_{meas}$ flowing in the collector terminal C of the transistor under test TUT. In order to obtain valid results from this test, the measurement instruments must be configured appropriately for the type and pinout of the transistor under test. Furthermore, if $H_{fe}$ of the transistor under test TUT is large, then injecting a small base current $I_B$ may produce a large collector current $I_{meas}$. However, in portable instruments which rely on battery power, it is undesirable to produce large currents, because they may substantially reduce battery life.

Therefore, it is a general aim of the present invention to provide an improved transistor tester.

SUMMARY OF THE INVENTION

In accordance with the foregoing aim, and other aims which will be readily apparent to those skilled in the art, a method of finding the forward $H_{fe}$ of a transistor under test having a first terminal, a second terminal and a third terminal is provided. According to the method of the present invention, a diode check is performed between the first terminal and the second terminal of the transistor. A diode check is a simple test, known to those skilled in the art, for determining the existence and polarity of a single P-N junction in a semiconductor device. In BJTs, such P-N junctions exist between the base and collector, and between the base and emitter. These junctions may be identified by use of a diode check. A diode check is also performed between the second terminal and the third terminal of the transistor. The transistor type and the base terminal of the transistor are identified in accordance with the results of the diode checks. Once the transistor type and base terminal are known, the $H_{fe}$ of the transistor may be measured.

According to the present invention $H_{fe}$ may be measured by injecting a current into one unidentified terminal of the transistor, i.e. a terminal other than the base terminal. A current flows in the base terminal of the transistor, responsive to the current injected. This base current is measured. Furthermore, by alternatively injecting a current into the other unidentified terminal and measuring the current flowing in the base terminal of the transistor, the forward $H_{fe}$ and the identities of the collector and emitter terminals may be determined.

The present invention may be better understood with reference to the accompanying drawings, wherein like reference designations represent like elements.

BRIEF DESCRIPTION OF THE DRAWINGS

FIG. 2 is a block diagram of a transistor checker which may be used to practice the method of the present invention.

FIG. 3 is a flow chart of a transistor checking method according to the present invention.

FIG. 4 is a truth table relating transistor type and base terminal connection to diode check results.

FIG. 5 is a flow chart of one embodiment of FIG. 3, step 307.

FIG. 6 is a flow chart of an alternate embodiment of FIG. 3, step 307.

DETAILED DESCRIPTION OF THE INVENTION

Figure 1B:
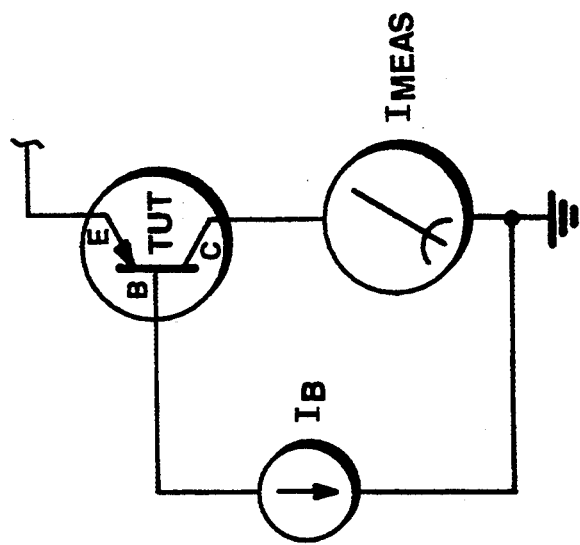
FIG. 1a and FIG. 1b are schematic representations of a transistor checker according to the prior art.

The present invention, and specific embodiments thereof are now described with reference to the figures.

An apparatus suitable for practicing the method of the present invention is shown in a representative block diagram in FIG. 2. First, second and third-terminals 201, 203 and 205 of a transistor under test TUT are connected respectively to tester terminals X, Y and Z. Test signals may be applied to the transistor under test TUT through tester terminals X, Y and Z. Responses of the transistor under test TUT to test signals applied thereto are monitored through tester terminals X, Y and Z.

Application of test signals and measurement of responses is achieved through the intermediary of switch matrix 207. A plurality of test circuit signals 209 and 211 may be selectively connected with tester terminals X, Y and Z by switch matrix 207. Thus, diode check circuit 213 and $H_{fe}$ measurement circuit 215 may be connected to transistor under test TUT in a variety of configurations.

A method of finding the $H_{fe}$ of a transistor under test TUT using the apparatus of FIG. 2, is now described in connection with FIGS. 3 and 4. The steps of the method are set forth in the flow chart of FIG. 3.

First, switch matrix 207 is configured to make connections between diode check circuit 213 and tester terminals X and Y, for performance of a first diode check (Step 301). Possible embodiments of this diode check are discussed below in connection with FIGS. 8a, 8b, 9a and 9b. These diode checks are performed in two parts, with switch matrix 207 configured to make the connections shown in each part in turn.

A second diode check (step 303) is performed between tester terminals Y and Z, by appropriate configurations of switch matrix 207. The possible results of the first and second diode checks may be represented as shown in the first two columns of FIG. 4.

Depending on the transistor type and which tester terminal has been connected to the base terminal of the transistor under test TUT, three results are possible for each diode check. The diode check may indicate an open circuit ("OPEN" in FIG. 4) between the terminals, the diode check may indicate a diode connected with the anode at one terminal, or the diode check may indicate a diode connected with the anode at the other terminal. FIG. 4 is a truth table which relates the six combinations of diode check results to the transistor type and base terminal connection indicated by those results. For example, if diode check 1 indicates that a diode is connected between terminals X and Y, having the anode at terminal X, and diode check 2 indicates an open circuit; then the transistor under test TUT is an NPN transistor having the base terminal connected to tester terminal X. Thus, by use of this truth table or by use of logic implementing the function of this truth table, transistor type and the base terminal connection may be derived from the results of the first and second diode checks (step 305).

Once the transistor type and base terminal connections are known, $H_{fe}$ may be measured (step 307). Two alternatives with respect to performing the $H_{fe}$ test are now discussed in connection with FIGS. 5 and 6.

A test for $H_{fe}$ may serve a variety of purposes. One possible purpose includes identifying the three terminals 201, 203 and 205 of the transistor under test TUT, together with determining the actual $H_{fe}$ of the transistor under test TUT, as accomplished in the additional method steps of FIG. 5. Another possible purpose is to only complete identification of the three terminals 201, 203, and 205 of the transistor under test TUT as accomplished by the additional method steps of FIG. 6. FIGS. 5 and 6 are now discussed in turn.

In FIG. 5, an assumption is made with respect to the collector/emitter (C/E) orientation of the transistor under test TUT (step 501). That is, the tester terminal to which the base of the transistor is connected is known. Of the remaining two tester terminals, one is assumed to be connected to the collector of the transistor, while the other is assumed to be connected to the emitter of the transistor. A test for $H_{fe}$ is performed on the basis of that assumption (step 501). Next, the other possible C/E orientation is assumed, and the $H_{fe}$ test is repeated (step 503). One of steps 501 and 503 will produce a larger value for $H_{fe}$ than the other. This larger value for $H_{fe}$ is the desired, forward characteristic of the transistor under test TUT. Therefore, the larger value of $H_{fe}$ and the C/E orientation which produced that larger value of $H_{fe}$ is reported as the result (step 505).

If only the correct orientation of the transistor under test is desired, the simpler and quicker test of FIG. 6 may be performed. Since the desired, forward $H_{fe}$ is typically large with respect to a fixed threshold, the $H_{fe}$ test may be performed once using one assumed C/E orientation (step 601). The result may be compared to the threshold (step 603) and either the assumed orientation is reported (step 605) or the other orientation is reported (step 607) as the result.

Figure 7B:
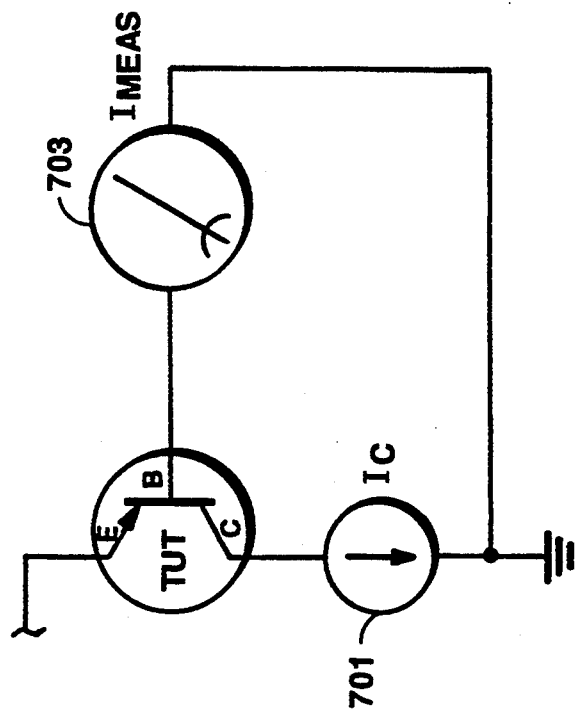
FIG. 7a and FIG. 7b are schematic representations of a circuit for practicing a method of measuring $H_{fe}$ according to the present invention.

An $H_{fe}$ test according to the present invention is now described in connection with FIGS. 7A and 7B. These figures illustrate the same test, as applied to an NPN type transistor under test TUT (FIG. 7A) and a PNP type transistor under test TUT (FIG. 7B). The tests are identical and therefore, described together. A collector current $I_c$ is injected in the collector C of transistor under test TUT by current source 701. The injected collector current $I_c$ causes a base current $I_{meas}$ to flow in the base of transistor under test TUT. The base current $I_{meas}$ is measured by metering circuits 703, which are known in the art. $H_{fe}$ may then be calculated conventionally, in accordance with the relationship:

$$H_{fe} = \frac{I_c}{I_{meas}}.$$

Figure 7A:
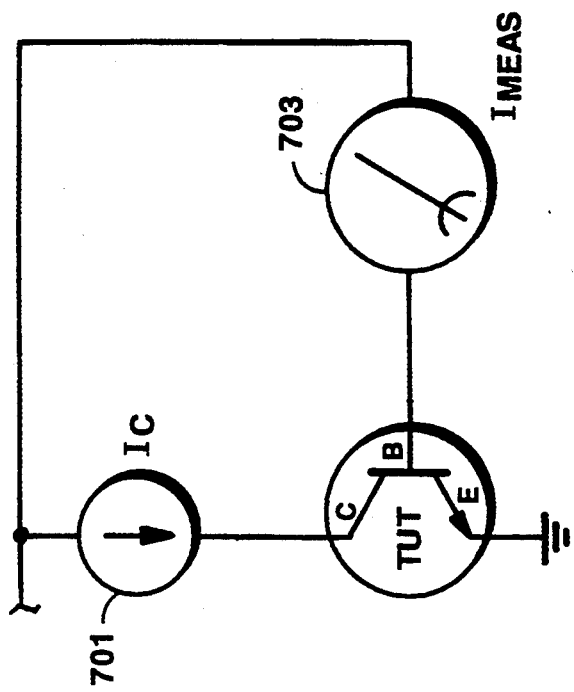

The collector and emitter terminals shown in FIGS. 7A and 7B are those assumed in each of the $H_{fe}$ tests described above.

Figure 1A:
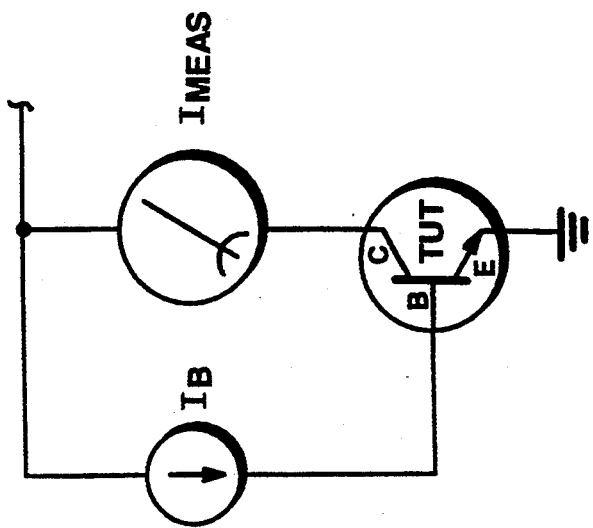

By injecting collector current $I_c$ and measuring base current $I_{meas}$, far less current may be drawn by the transistor tester according to the present invention, because $I_c$ may be chosen to be small, and $I_{meas}$ will be smaller than $I_c$ for a typical transistor under test TUT. This is in contrast to the prior art tests of FIGS. 1A and 1B, wherein a small injected $I_b$ could result in a large $I_{meas}$, because of the $H_{fe}$ of the transistor under test TUT.

Furthermore, the measurement of $H_{fe}$ according to the present invention produces a more accurate result than that of the prior art, because $H_{fe}$ is a function of collector current $I_c$. In a tester according to the present invention, $I_c$ is a controlled parameter which may be selected to be substantially equal to a value used in a specific application of a transistor, for example. Thus, the measured $H_{fe}$ is that experienced when using the transistor in the specific application.

Diode tests are discussed above in connection with FIGS. 2 and 3, are now described in connection with FIGS. 8A, 8B 9A and 9B. These figures simply illustrate known methods for determining the existence and plurality of a diode between a pair of terminals. In each pair of figures, the first figure illustrates the first half of a test, wherein one polarity is tested, while the second figure illustrates the second half of a test, wherein the second polarity is tested.

Figure 8A:
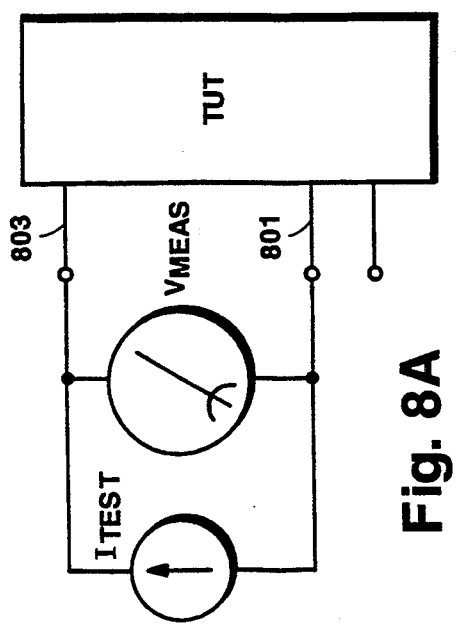
FIG. 8a and FIG. 8b are schematic representations of a circuit for performing a diode check with respect to two terminals of a transistor under test.
Figure 8B:
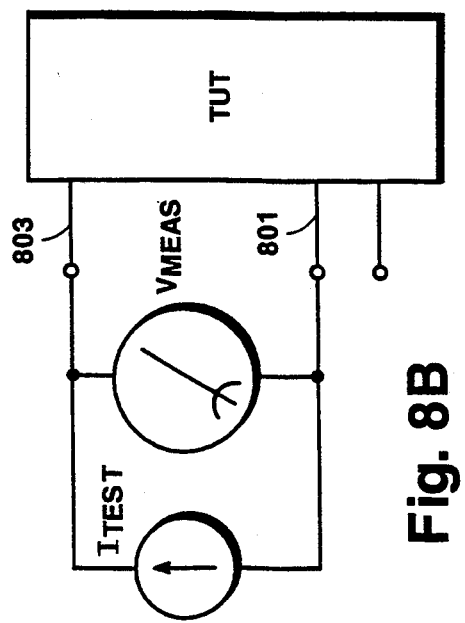

In FIGS. 8A and 8B, the existence and polarity of a diode is tested for by connecting a source of current $I_{test}$ across a pair of terminals 801 and 803 of the transistor under test TUT. In FIG. 8A, the source injects current $I_{test}$ into terminal 803 and extracts current $I_{test}$ from terminal 801. In FIG. 8B, the current source has been reversed, so that it injects current $I_{test}$ into terminal 801 and extracts current $I_{test}$ from terminal 803. In each case, the voltage between terminals 803 and 801, $V_{meas}$ is measured. If the two parts of this test produce different values for $V_{meas}$, then the test indicates a diode connected between terminals 801 and 803. The anode of the diode is connected to the one of terminals 801 and 803 into which current $I_{test}$ was injected when the smaller $V_{meas}$ was produced. If substantially similar values for $V_{meas}$ are produced by the two parts of this test, then the reported result is "OPEN", as noted in the first two columns of FIG. 4.

Figure 9A:
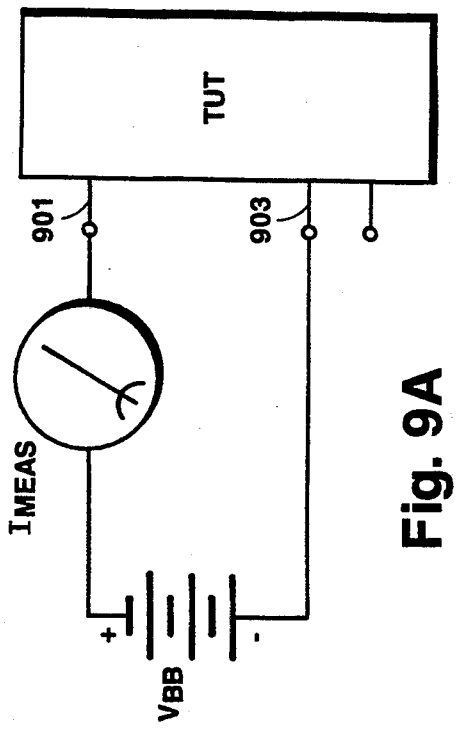
FIG. 9a and FIG. 9b are schematic representations of another circuit for performing a diode check with respect to two terminals of a transistor under test.
Figure 9B:
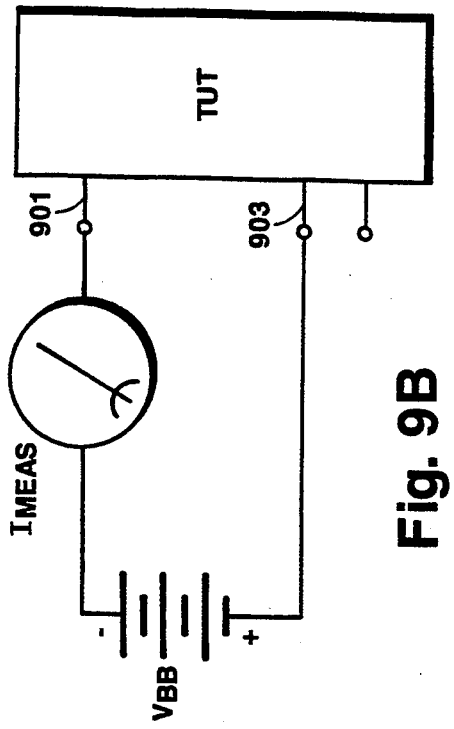

FIGS. 9A and 9B illustrate a similar test, performed using the Thevenin equivalents of the circuits illustrated in FIGS. 8A and 8B. In this two-part test, a voltage $V_{BB}$ is applied across terminals 901 and 903 of the transistor under test TUT. If a diode is connected across terminals 901 and 903, then the magnitude of the current flowing in the terminals $I_{meas}$ will be large when the positive terminal of the source of voltage $V_{BB}$ is connected to the anode of the diode. If $I_{meas}$ is small under both parts of this test, then the test reports "OPEN" as seen in the first and second columns of FIG. 4.

Although the present invention has been described in connection with a number of specific embodiments, numerous extensions, modifications and other applications should now be evident to those skilled in the art. The embodiment presented herein are illustrative, and not to be considered limiting, having been presented by way of example only. The scope of the present invention is limited only by the appended claims and equivalents thereto.

What is claimed is:

1. An automatic transistor checker for determining a value of $H_{fe}$ of a transistor under test having a first terminal, a second terminal and a third terminal comprising:
   connector means for selectively connecting a plurality of test signal lines to the first terminal, the second terminal and the third terminal in an automatic sequence;
   diode check means for performing diode checks between the first terminal and the second terminal, and the second terminal and the third terminal by sequencing test signals through one or more of the test signal lines, said diode check means including;
   i. base terminal identification means for identifying which of the first, second or third terminals is a base terminal based on the results of the diode checks; and
   ii. collector terminal identification means for identifying which of the first, second or third terminals not previously identified as the base terminal is a collector terminal; and
   an $H_{fe}$ measurement circuit means for determining a value for $H_{fe}$;
   wherein the diode check means varies the sequence of test signals applied to the test signal lines in response to the terminals and the transistor type identified by the base terminal identification means and thereafter by the collector terminal identification means and the $H_{fe}$ measurement circuit determines $H_{fe}$ based on the identified terminals.

2. The automatic transistor checker as recited in claim 1, wherein the collector terminal identification means comprises:
   a current source for injecting a current into one of the two terminals not identified as the base terminal of the transistor under test;
   means for measuring a current flowing in the base terminal of the transistor under test;
   means for determining a ratio of the current injected and the current measured in the base terminal; and
   comparison means for comparing the ratio to a predetermined threshold, and if the ratio exceeds the threshold identifying the terminal into which current is injected as the collector terminal, said comparison means identifying as the collector terminal the other of the terminals not identified as the base terminal, if the ratio is below the predetermined threshold.

3. An automatic transistor checker as recited in claim 2, wherein the means for performing a diode check further comprises:
   a source of DC voltage having at least two terminals, one terminal connected to one of the three terminals of the transistor under test; and
   means for measuring a current connected between a second terminal of the source of DC voltage and a second of the three terminals of the transistor under test.

4. The automatic transistor checker as recited in claim 1, wherein the means for performing a diode check further comprises:
   a current source selectively connected across two of the three terminals of the transistor under test, said current source injecting current into one of the terminals and thereafter injecting current into another of the two terminals; and
   measuring means for measuring a voltage difference between the two terminals of the transistor under test, said measuring means measuring the voltage in response to the current source injecting current into the terminals;
   diode identification means for determining if a diode is present in a junction between the two terminals to which the current source is selectively connected, said diode identification means identifying a diode in the junction if the voltage corresponding to injecting current into one of the terminals differs by more than a minimal amount from the voltage corresponding to injecting current into a second of the terminals;
   wherein said current source is selectively connected between another two terminals and said measuring means and said diode identification means operate to determine if a diode is present in the junction between the two terminals.

5. Apparatus for measuring $H_{fe}$ of a transistor under test having a base terminal, a collector terminal and an emitter terminal, comprising:
   a current source for injecting a current into the collector terminal of the transistor under test;
   means for measuring a current flowing in the base terminal of the transistor under test; and
   means for determining a ratio of the current injected into the collector terminal and the current flowing in the base terminal.

* * * * *